(12) United States Patent
Pandey et al.

(10) Patent No.: US 10,840,245 B1
(45) Date of Patent: Nov. 17, 2020

(54) SEMICONDUCTOR DEVICE WITH REDUCED PARASITIC CAPACITANCE

(71) Applicant: GLOBALFOUNDRIES INC., Grand Cayman (KY)

(72) Inventors: Shesh Mani Pandey, Saratoga Springs, NY (US); Jiehui Shu, Clifton Park, NY (US); Haiting Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/510,966

(22) Filed: Jul. 14, 2019

(51) Int. Cl.
| | |
|---|---|
| *H01L 27/088* | (2006.01) |
| *H01L 29/423* | (2006.01) |
| *H01L 29/417* | (2006.01) |
| *H01L 21/8234* | (2006.01) |
| *H01L 21/762* | (2006.01) |
| *H01L 29/66* | (2006.01) |

(52) U.S. Cl.
CPC .... *H01L 27/0886* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 29/41791* (2013.01); *H01L 29/42356* (2013.01); *H01L 29/66545* (2013.01)

(58) Field of Classification Search
None
See application file for complete search history.

(56) References Cited

U.S. PATENT DOCUMENTS

| | | |
|---|---|---|
| 9,153,669 B2 | 10/2015 | Anderson et al. |
| 9,443,944 B2 | 9/2016 | Zang et al. |
| 10,170,581 B2 | 1/2019 | Alptekin et al. |
| 2017/0005002 A1* | 1/2017 | Ching ................ H01L 29/0653 |
| 2020/0135580 A1* | 4/2020 | Hsieh ............. H01L 21/823481 |

\* cited by examiner

*Primary Examiner* — J. E. Schoenholtz
(74) *Attorney, Agent, or Firm* — David Cain

(57) ABSTRACT

A semiconductor device comprising a substrate, a first fin and a second fin disposed on the substrate and an isolation material disposed on the substrate, wherein the isolation material separates the first fin and the second fin. A dielectric block is disposed between the first fin and the second fin, wherein the dielectric block is over the isolation material. A gate electrode covers the dielectric block.

20 Claims, 9 Drawing Sheets

SEMICONDUCTOR DEVICE WITH REDUCED PARASITIC CAPACITANCE

FIELD OF THE INVENTION

The disclosed embodiments relate generally to semiconductor devices, and more particularly to semiconductor devices with reduced parasitic capacitance between gate(s) and source and/or drain contact(s).

BACKGROUND

As semiconductor devices continue to scale downward in size, the Fin Field-Effect-Transistor (FinFET) has become an attractive device for use with smaller nodes e.g., 14 nm node and below. In a FinFET, a channel is formed in a semiconductor fin and a gate electrode is located on at least two sides of the fin. Due to the advantageous feature of full depletion in a FinFET, the increased number of sides on which the gate electrode controls the channel in a FinFET enhances the controllability of the channel in a FinFET. The improved control of the channel allows smaller device dimensions with less short channel effects, as well as larger electrical current that can be switched at high speeds.

However, the three dimensional nature of the FinFETs and the multiple fins making up the transistors introduce a large number of parasitic capacitances. In particular, FinFET parasitic gate to source and/or drain contact capacitance continues to increase due to scaling of the gate pitch. The parasitic capacitance degrades device performance as it slows down the device speed. Hence, there is an urgent need to reduce the parasitic capacitances in FinFET devices for 14 nm technology nodes and below.

SUMMARY

In an aspect of the disclosure, a semiconductor device comprises a substrate with a first fin and a second fin disposed on the substrate. An isolation material is disposed on the substrate, wherein the isolation material separates the first fin and the second fin. A dielectric block is disposed between the first fin and the second fin, wherein the dielectric block is over the isolation material. A gate electrode covers the dielectric block.

In another aspect of the disclosure, a semiconductor device comprises a substrate with a first fin and a second fin disposed on the substrate. An isolation material is disposed on the substrate, wherein the isolation material separates the first fin and the second fin. A gate structure having a dielectric block is disposed on the isolation material. A gate electrode covers the dielectric block.

In yet another aspect of the disclosure, a method to fabricate a semiconductor device comprises providing a first fin and a second fin disposed on a substrate, wherein the first fin and the second fin are separated by an isolation material. A sacrificial material is deposited over the first fin, the second fin and the isolation material. A dielectric block is formed over the sacrificial material between the first fin and the second fin. The sacrificial material is removed. A gate electrode is deposited over the dielectric block.

Numerous advantages may be derived from the embodiments described below wherein a dielectric block is formed between the sidewalls of a gate structure. The dielectric block is disposed between a first fin and a second fin. The gate structure transverse the first fin and the second fin and comprises conductive materials such as a gate electrode and a metal layer. The conductive materials cover the dielectric block.

Source drain contacts may be formed over epitaxial regions in the first fin and the second fin. A dielectric layer may separate the source drain contacts from the gate structure. As the dielectric block reduces an effective area of the conductive materials parallel to source drain contacts, the parasitic capacitance between the gate and source drain contacts is reduced. This leads to improved device performance and higher device speeds.

In addition, no additional masking steps are required to fabricate the semiconductor devices described below. Hence, the fabrication process does not incur significant additional cost or added complexity.

BRIEF DESCRIPTION OF THE DRAWINGS

The disclosed embodiments will be better understood from a reading of the following detailed description, taken in conjunction with the accompanying drawings.

Figure 1:
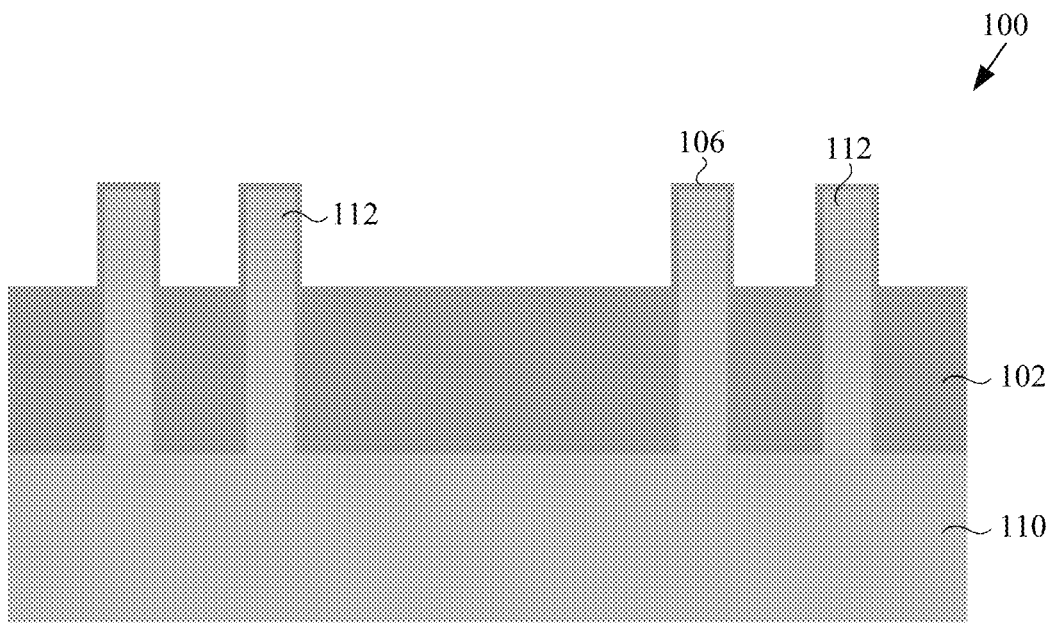
FIG. 1 is a cross-section view of a partially completed semiconductor device according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

FIG. 1 is a cross-section view of a partially completed semiconductor device 100 according to an embodiment of the disclosure. Referring to FIG. 1, the semiconductor device 100 comprises a plurality of fins 112 disposed on a substrate 110, and the fins 112 are separated by an isolation material 102. A dielectric layer 106 is formed covering the sidewalls and top surfaces of the fins 112.

The fins 112 generally define active regions for forming source and drain regions and channel regions underneath gate structures for the semiconductor device 100. While the fins 112 define active regions for the semiconductor device 100 in the present disclosure, it should be noted that the fin 112 is used only as a non-limiting example of an active region. Other active regions (e.g., a doped layer on a top surface of a bulk semiconductor substrate or a semiconductor-on-insulator layer, etc.) may be used for different types of transistor devices In accordance with the embodiment in FIG. 1, the substrate 110 may include any appropriate semiconductor material, such as silicon, silicon germanium, silicon carbon, other II-VI or III-V semiconductor compounds and the like. In one embodiment of the disclosure, the semiconductor material of the substrate 110 is preferably silicon. The isolation material 102 may include any suitable insulating material, such as silicon dioxide or silicon nitride. In an aspect of the present disclosure, the isolation material 102 is a shallow trench isolation (STI). The insulating material in the shallow trench isolation is preferably silicon dioxide. The dielectric layer 106 may be made of silicon dioxide. The dielectric layer 106 may be formed by thermal oxidation, chemical vapor deposition (CVD), physical vapor deposition (PVD) or atomic layer deposition (ALD).

Figure 2:
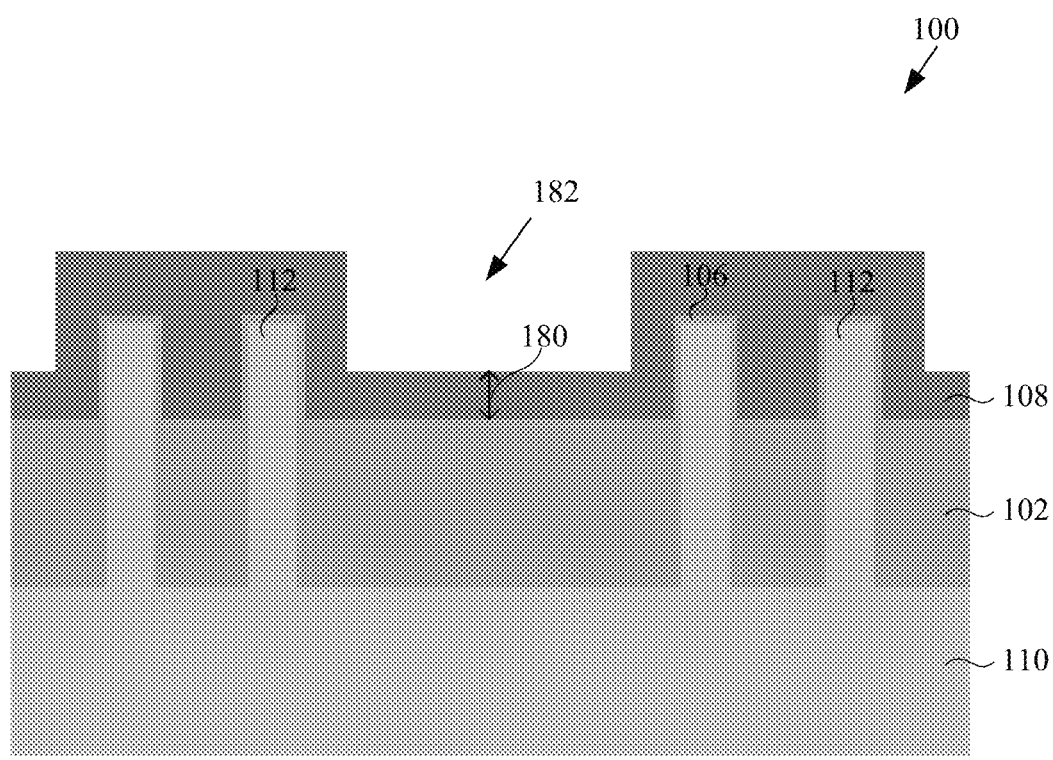
FIG. 2 follows from FIG. 1 after the deposition of a sacrificial material, in accordance with one or more aspects of the disclosure.

FIG. 2 follows from FIG. 1 after the conformal deposition of a sacrificial material 108 over the plurality of fins 112 and the isolation material 102 between the fins 112, in accordance with one or more aspects of the disclosure. The sacrificial material 108 may be made of aluminum oxide ($Al_2O_3$), titanium nitride (TiN), titanium oxide ($TiO_2$) or any other suitable material. The sacrificial material 108 may be deposited by CVD, PVD, ALD or any other suitable deposition methods. The thickness 180 of the deposited sacrificial material 108 ranges between 5 and 30 nm, and preferably between 10 nm and 25 nm.

Figure 3:
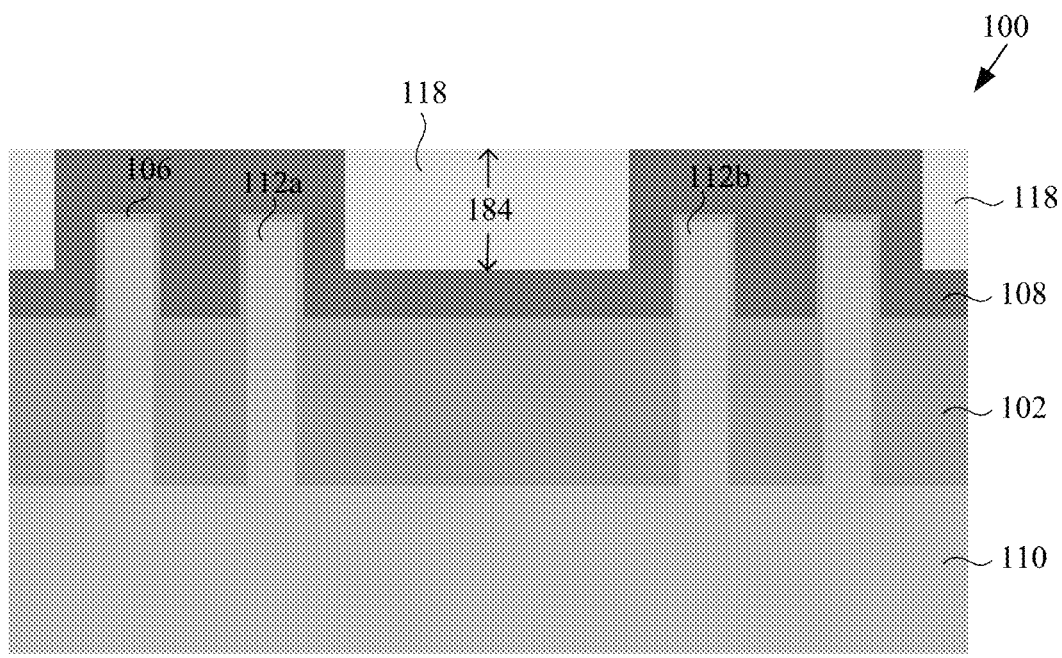
FIG. 3 follows from FIG. 2 after the formation of a dielectric block, in accordance with one or more aspects of the disclosure.

FIG. 3 follows from FIG. 2 after the formation of a dielectric block 118 over the sacrificial material 108 between a first fin 112a and a second fin 112b, in accordance with one or more aspects of the disclosure. The dielectric block 118 may be made by uniformly depositing a layer of silicon dioxide ($SiO_2$), silicon nitride (SiN), silicon oxynitride (SiON), silicon oxycarbonitride (SiOCN), silicon carbonitride (SiCN), silicon oxycarbide (SiOC) or boron-doped silicon carbonitride (SiBCN) over the sacrificial material 108 to fill up an opening 182 between the first fin 112a and the second fin 112b, followed by selectively removing the deposited layer outside the opening 182. The thickness 184 of the deposited layer ranges between 30 nm and 60 nm, and preferably between 40 nm and 50 nm. Possible deposition methods for the formation of the dielectric block 118 are CVD, PVD, ALD or any other suitable deposition methods. The selective removal may include selective etching or chemical mechanical planarization (CMP).

The term "selective etching" means a chemical etching method which can selectively remove a target layer without attacking the layer beneath the target layer, termed a stop layer for this reason, by adjusting the composition of the chemical solution and, as a result, adjusting the etching rates between the target layer and the stop layer.

Figure 4:
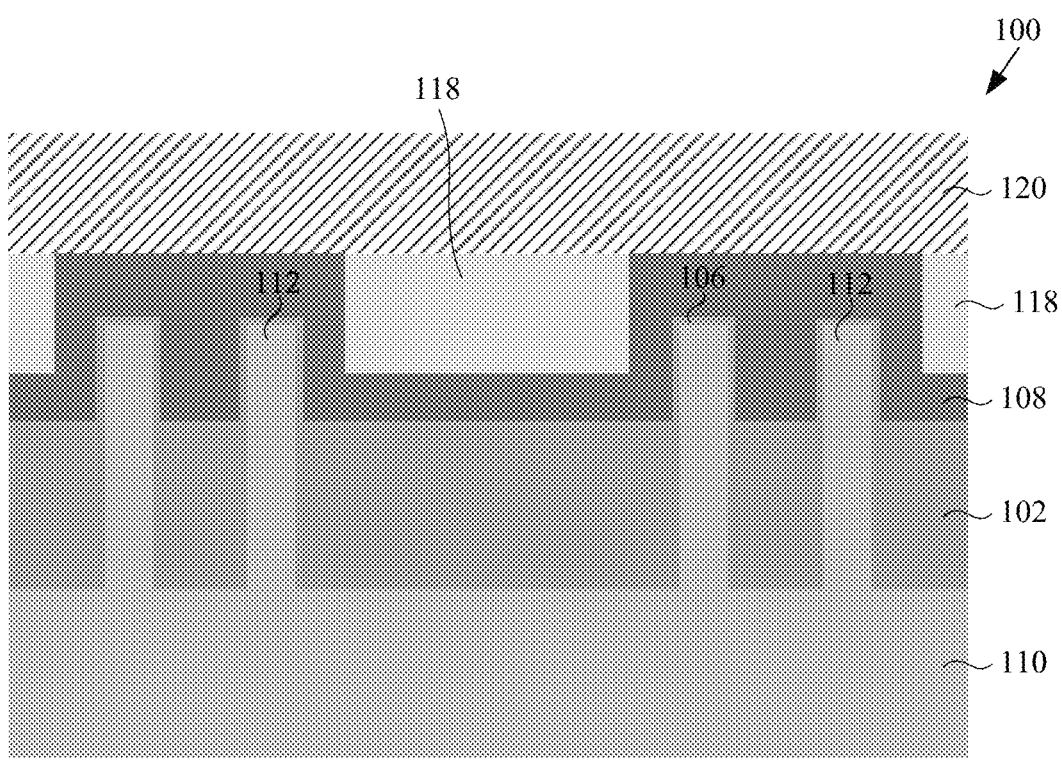
FIG. 4 follows from FIG. 3 after the deposition of a dummy gate material layer, in accordance with one or more aspects of the disclosure.

FIG. 4 follows from FIG. 3 after the deposition of a dummy gate material layer 120 over the dielectric block 118 and the sacrificial material 108, in accordance with one or more aspects of the disclosure. The dummy gate material layer 120 may be made of amorphous silicon and may be deposited by CVD, PVD, ALD or any other suitable deposition methods.

Figure 5:
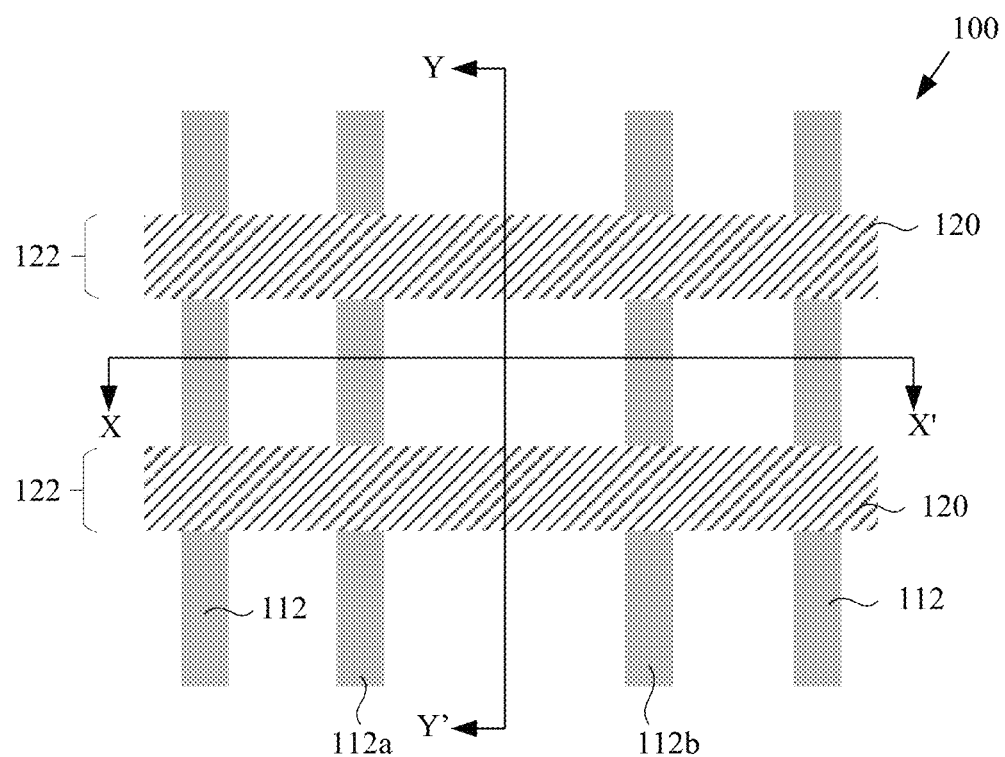
FIG. 5 is a top view of a partially completed semiconductor device in accordance with one or more aspects of the disclosure.

FIG. 5 is a top view of a partially completed semiconductor device 100 in accordance with one or more aspects of the disclosure. Referring to FIG. 5, dummy gate structures 122 transverse the plurality of fins 112, including across the first fin 112a and the second fin 112b. Also shown are the section lines X-X' and Y-Y' that are used to present further aspects of the disclosure in the following figures.

Figure 6A:
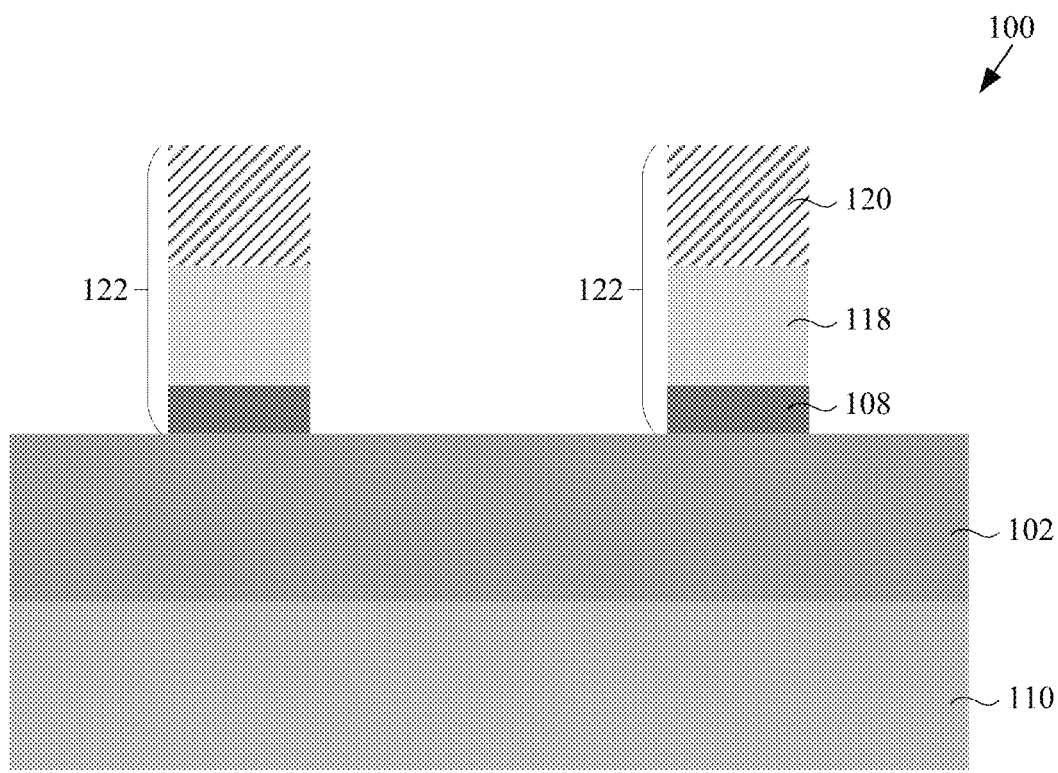
FIGS. 6A and 6B are cross-section views taken along the section lines Y-Y' and X-X', respectively, of FIG. 5.

FIG. 6A is a cross-section view taken along the section line Y-Y' of FIG. 5. Although not shown, patterning of the dummy gate structures 122 may include depositing a layer of photoresist material on the dummy gate material layer 120 followed by conventional photoresist exposure and developing to form photoresist patterns that are consistent with prior art practices. A wet etch or dry etch process may be used to remove portions of the dummy gate material layer 120, the dielectric block 118 and the sacrificial material 108 that are not covered by the photoresist patterns. Although not shown, the photoresist material is removed after the etching processes.

Figure 6B:
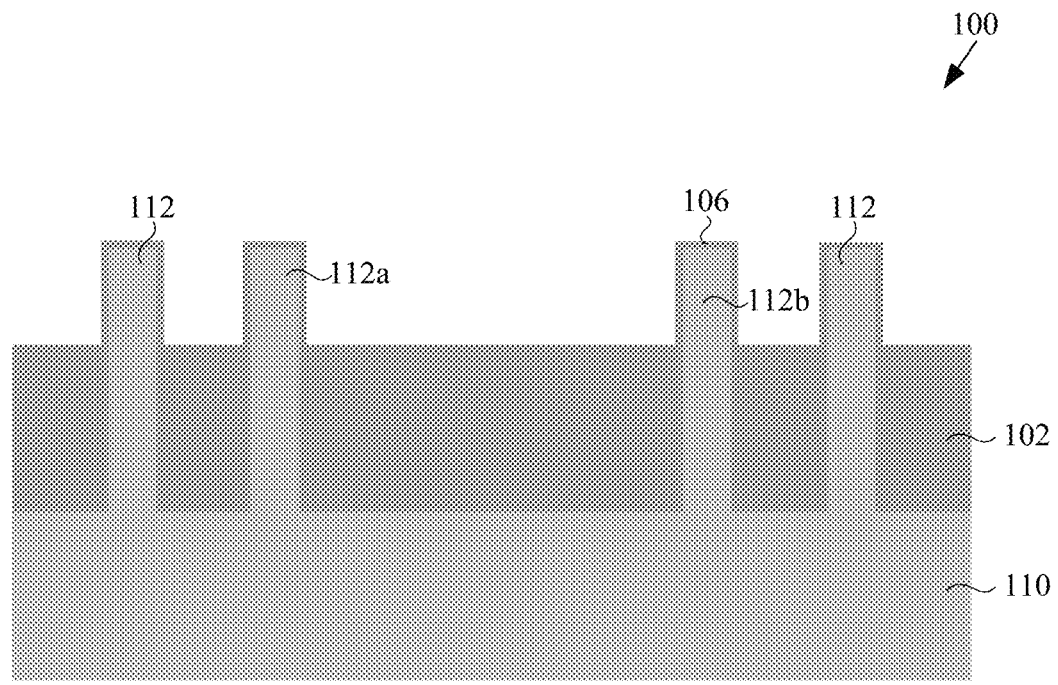

FIG. 6B is a cross-section view taken along the section line X-X' of FIG. 5. Referring to FIG. 6B, the formation of the dummy gate structures 122 exposes portions of the plurality of fins 112. The dielectric layer 106 remains covering the sidewalls and top surfaces of the fins 112.

Figure 7A:
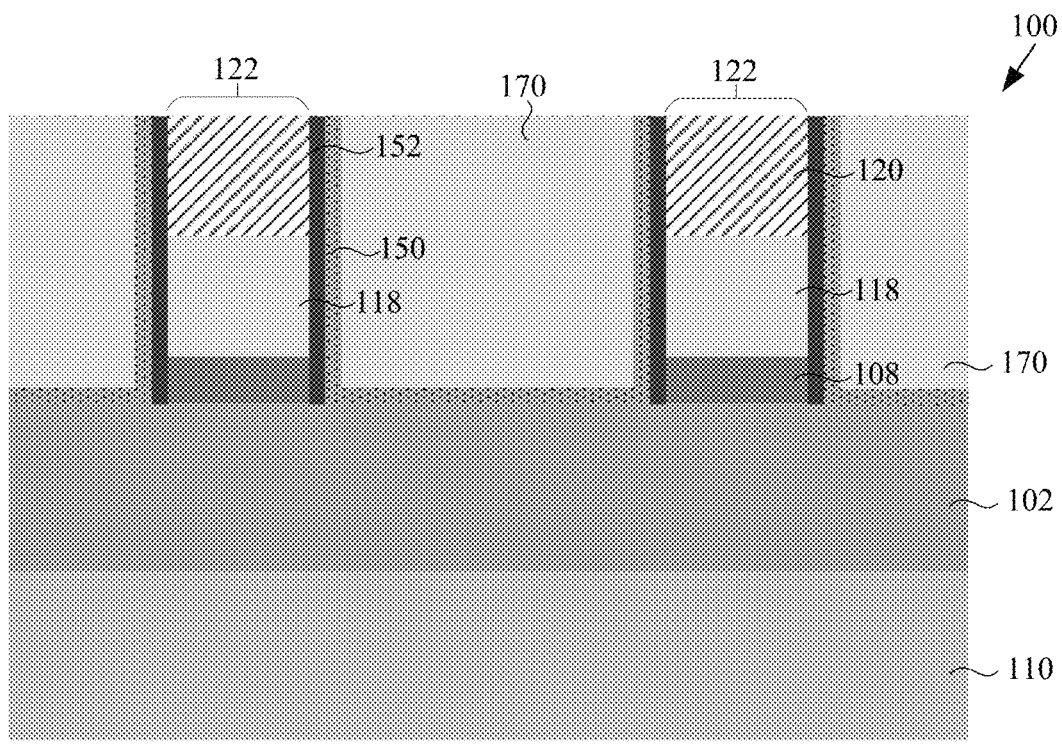
FIG. 7A follows from FIG. 6A and FIG. 7B follows from FIG. 6B after spacer formation, epitaxial growth and interlayer dielectric deposition, in accordance with one or more aspects of the disclosure.
Figure 7B:
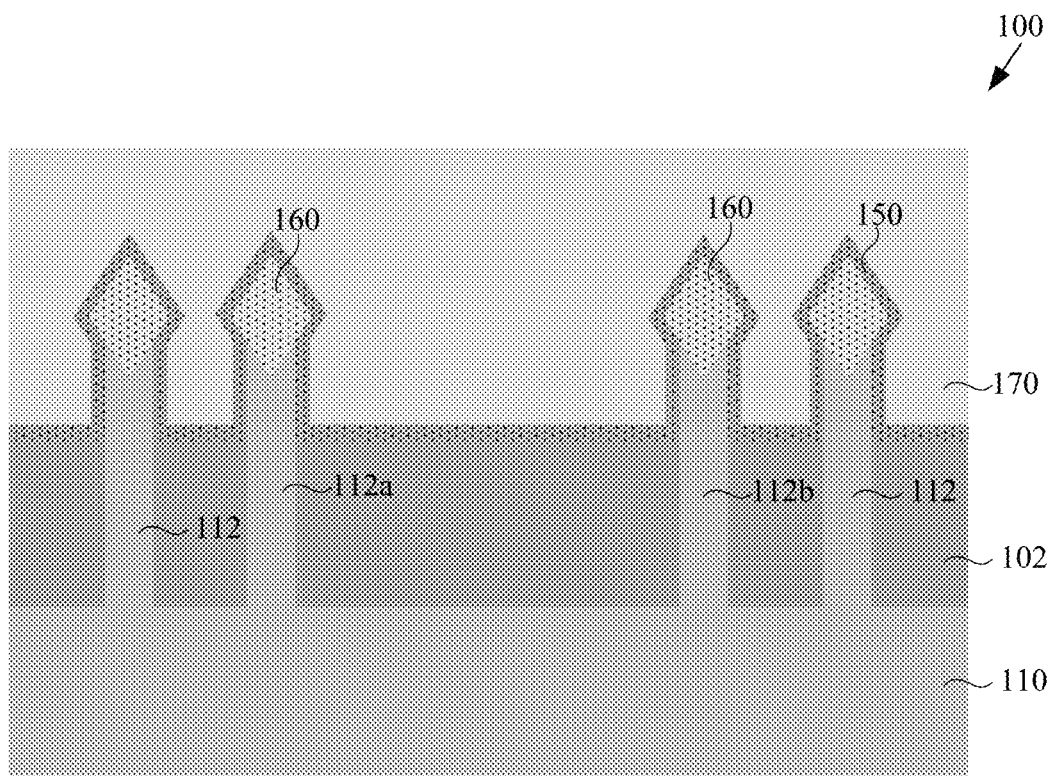

FIG. 7A follows from FIG. 6A while FIG. 7B follows from FIG. 6B after spacer structure 152 formation, formation of epitaxial structures 160 and interlayer dielectric 170 deposition, in accordance with one or more aspects of the disclosure. Referring to FIG. 7A, spacer structures 152 may be formed on sidewalls of the dummy gate structures 122. Spacer structure formation includes depositing a layer of low-k dielectric material, followed by anisotropic etching of the low-k dielectric material, consistent with prior art practices. The term "low-k" as used herein refers to a material having a dielectric constant (i.e., k value) that is lower than 7. Low-k dielectric materials may include SiN, SiON, SiCN, SiC, SiOC, SiOCN or SiBCN.

Referring to FIG. 7B, epitaxial structures 160 may be formed on exposed portions of the plurality of fins 112. The first fin 112a and the second fin 112b are collectively referred to as fins 112. The formation of the epitaxial structures 160 includes forming cavities in the exposed portions of the fins 112 followed by growth of the epitaxial structures 160 in the fin cavities, consistent with prior art practices. The dielectric layer 106 may be removed from the exposed portions of the plurality of fins 112 during the formation of the fin cavities. The epitaxial structures 160 may be doped to form source and/or drain regions of the semiconductor device 100. An etch stop layer 150 may subsequently be deposited over the epitaxial structures 160, side surfaces of the fins 112 and the isolation material 102. The etch stop layer 150 may also be deposited over the sidewalls of the dummy gate structures 122. In addition, the etch stop layer 150 may also be deposited over the dummy gate material 120 (not shown). The etch stop layer 150 may be made of silicon nitride. Interlayer dielectric (ILD) material 170 may subsequently be deposited over the plurality of fins 112 and dummy gate structures 122. A planarization process such as CMP may be used to remove portions of the interlayer dielectric material 170 from upper surfaces of the dummy gate structures 122. The etch stop layer 150 may also be removed from the upper surfaces of the dummy gate structures 122 during the CMP process. The interlayer dielectric 170 may be made of silicon oxide, silicon oxynitride, borosilicate glass (BSG), phosphoric silicate glass (PSG), fluorinated silicate glass (FSG), low-k material, another suitable material or a combination thereof. In some embodiments, the interlayer dielectric 170 includes multiple sub-layers.

Figure 8:
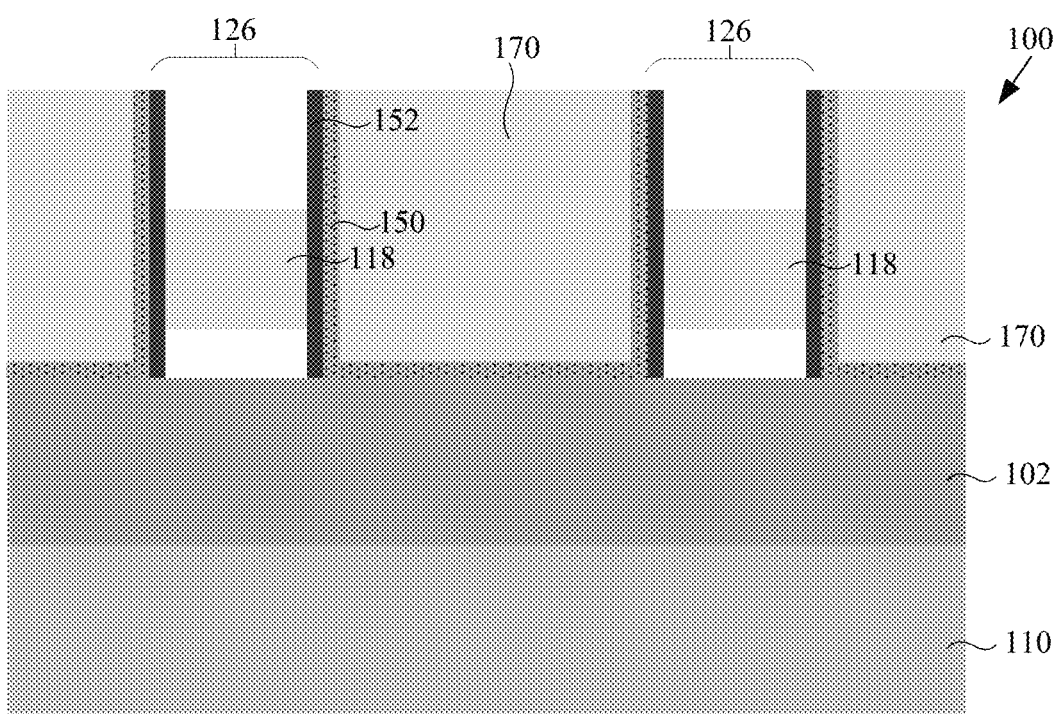
FIG. 8 follows from FIG. 7A after the removal of the dummy gate material and the sacrificial material, in accordance with one or more aspects of the disclosure.

FIG. 8 follows FIG. 7A after the removal of the dummy gate material 120 and the sacrificial material 108 from the dummy gate structures 122 to form gate structures 126, in accordance with the aspects of the disclosure. The removal processes may be performed by either wet or dry etch. The removal of the dummy gate material 120 exposes upper portions of sidewalls of the gate structures 126. The removal of the sacrificial material 108 exposes bottom surfaces, the under portion of the dielectric block 118, as well as lower portions of sidewalls of the gate structures 126.

Figure 9A:
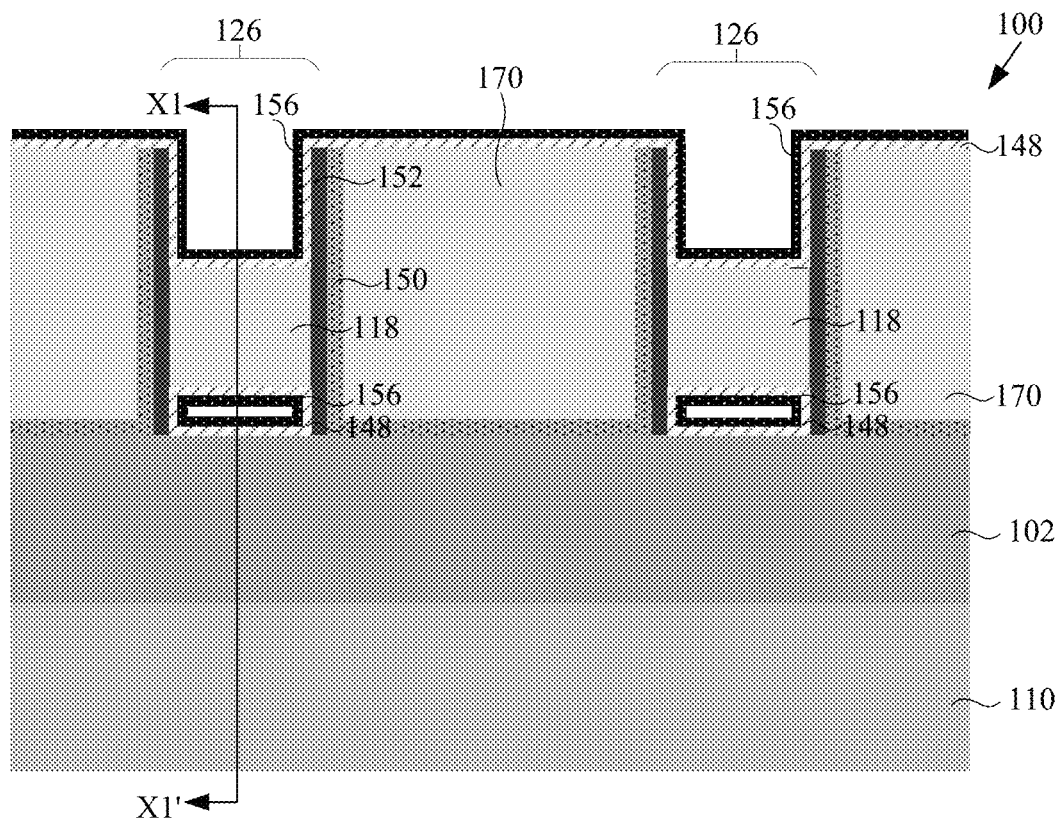
FIG. 9A follows from FIG. 8 after the deposition of a gate dielectric layer and a gate electrode layer, in accordance with one or more aspects of the disclosure.

FIG. 9A follows from FIG. 8 after the deposition of a gate dielectric layer 148 and a gate electrode layer 156, in accordance with one or more aspects of the disclosure. Referring to FIG. 9A the gate dielectric layer 148 and the gate electrode layer 156 may be deposited over the dielectric block 118. The dielectric block 118 may be disposed between the spacer structures 152 covering the sidewalls of the gate structure 126. In addition, the gate dielectric layer 148 and the gate electrode layer 156 may be deposited over upper and lower portions of the spacer structures 152 and over the bottom surfaces of the gate structures 126. The gate dielectric layer 148 and the gate electrode layer 156 may also be deposited over upper surfaces of the interlayer dielectric 170. In an aspect of the present disclosure, the gate dielectric layer 148 may be made of a high-k material. Also shown is the section line X1-X1' that is used to present further aspects of the disclosure in the following figures.

The term "high-k" as used herein refers to a material having a dielectric constant (i.e., k value) that is greater than 10. The high-k materials may include hafnium oxide ($HfO_2$), hafnium silicate (HfSiO), zirconium oxide ($ZrO_2$), titanium oxide ($TiO_2$), aluminum oxide ($Al_2O_3$), yttrium oxide ($Y_2O_3$), tantalum oxide ($Ta_2O_5$) or lanthanum oxide ($La_2O_3$). In an aspect of the present disclosure, the gate electrode layer 156 may be made of titanium nitride (TiN), tantalum nitride (TaN), aluminum (Al), titanium aluminide (TlAl), aluminum-doped titanium carbide (TiAlC), magnesium (Mg), palladium (Pd), platinum (Pt), molybdenum (Mo), nickel (Ni) or any other suitable materials. In one embodiment, the gate dielectric layer 148 and the gate electrode layer 156 may be deposited by ALD, CVD or PVD. In a preferred embodiment, the gate dielectric layer 148 and the gate electrode layer 156 are deposited by ALD.

Figure 9B:
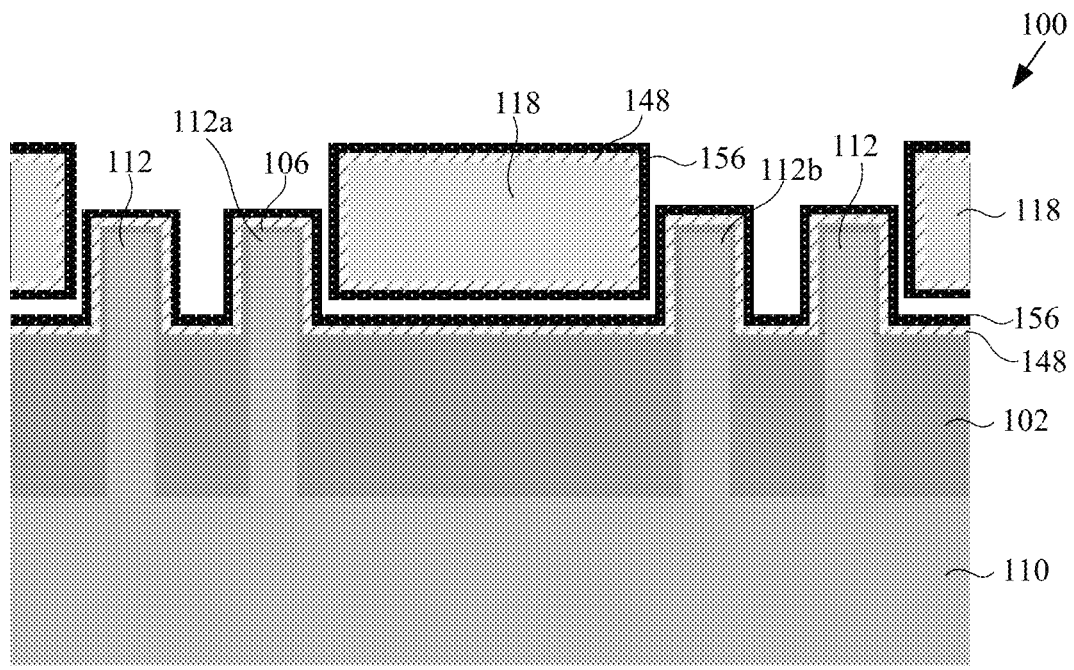
FIG. 9B is a corresponding cross-section view taken along section line X1-X1' of FIG. 9A.

FIG. 9B is a corresponding cross-section view taken along section line X1-X1' of FIG. 9A. Referring to FIG. 9B, the gate dielectric layer 148 and the gate electrode layer 156 may be deposited over the plurality of fins 112, i.e., over the first fin 112a and the second fin 112b, and dielectric block 118.

Figure 10A:
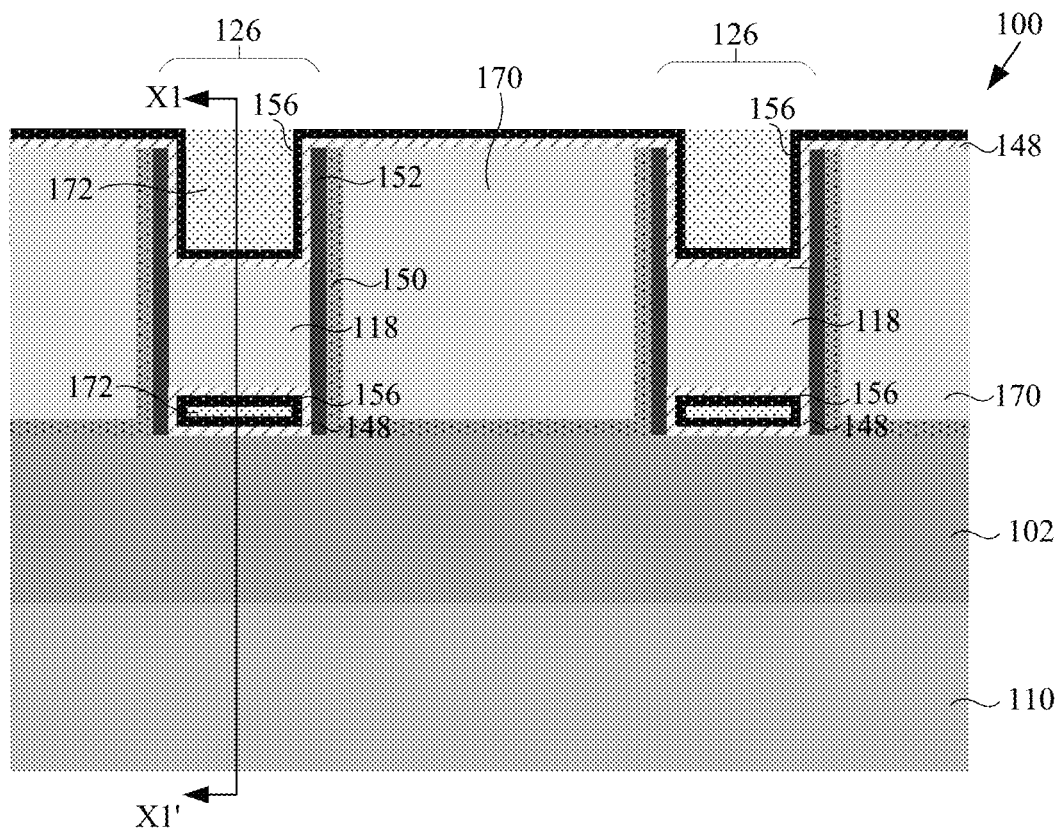
FIG. 10A follows from FIG. 9A and FIG. 10B follows from FIG. 9B, after the deposition of a metal layer, in accordance with one or more aspects of the disclosure.
Figure 10B:
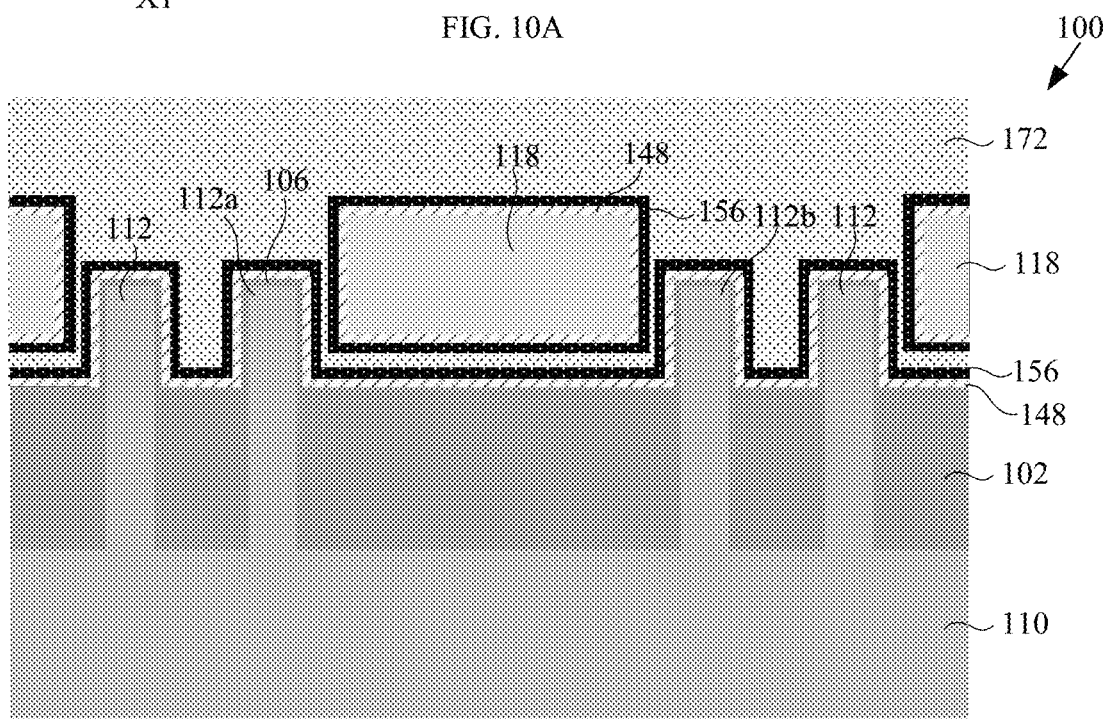

FIG. 10A follows from FIG. 9A and FIG. 10B follows from FIG. 9B, after the deposition of a metal layer 172 followed by planarization, in accordance with one or more aspects of the disclosure. The metal layer 172 may function as a gate contact. Referring to FIG. 10A, the metal layer 172 may be deposited over semiconductor device 100; in particular, over and underneath the dielectric block 118 and adjacent the upper and lower portions of the sidewalls. Hence, the metal layer 172 may separate the dielectric block 118 from the bottom surface of the gate structure 126.

In an aspect of the present disclosure, the metal layer 172 may be made of tungsten or W. In another aspect of the present disclosure, the metal layer 172 may be made of cobalt (Co), ruthenium (Ru), aluminum (Al) or copper (Cu). In one embodiment, the metal layer 172 may be deposited by CVD, ALD or PVD. In a preferred embodiment, the metal layer 172 may be deposited by CVD. The planarization process removes the gate electrode layer 156 and the metal layer 172 from upper surfaces of the interlayer dielectric 170. In an aspect of the present disclosure, the planarization process may be done by CMP.

Referring to FIG. 10B, the metal layer 172 is shown deposited over the plurality of fins 112, i.e., the first fin 112a and the second fin 112b, the dielectric block 118 and the isolation material 102. Hence, the metal layer 172 separates the dielectric block 118 from the first fin 112a, the second fin 112b and the isolation material 102.

Figure 11:
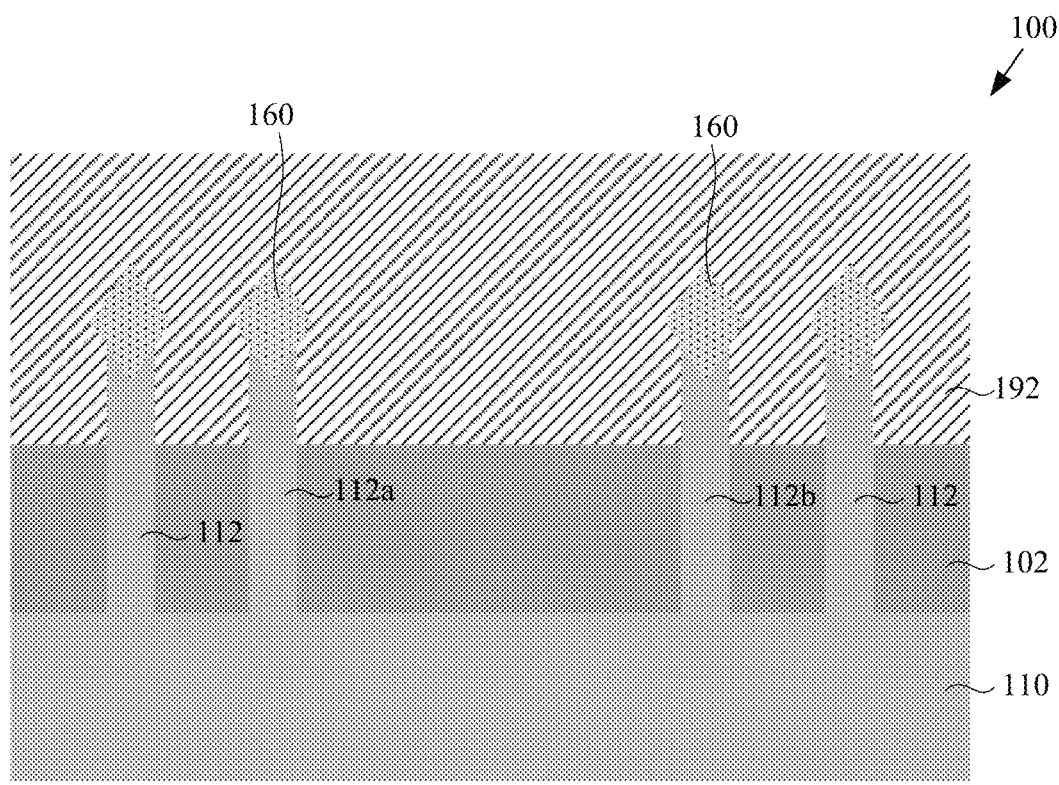
FIG. 11 follows from FIG. 7B after source and drain contact 192 formation.

FIG. 11 follows from FIG. 7B after source and drain contact 192 formation. Although not shown, patterning of the source and drain contact 192 may include depositing a layer of photoresist material on the interlayer dielectric 170 followed by conventional photoresist exposure and developing to form photoresist patterns, consistent with prior art practices. A wet etch or dry etch process may be used to remove portions of the interlayer dielectric 170 that are not covered by the photoresist patterns to expose the epitaxial structures 160. The etching process stops on the contact etch stop layer 150 (as shown in FIG. 7B). Although also not shown, the photoresist material and the contact etch stop layer 150 are removed after the etching processes. A layer of suitable metal such as W, Co, Ru or Cu is deposited over the epitaxial structures 160 followed by a suitable planarization process to form the source and drain contact 192. The planarization process may be a CMP process.

Figure 12:
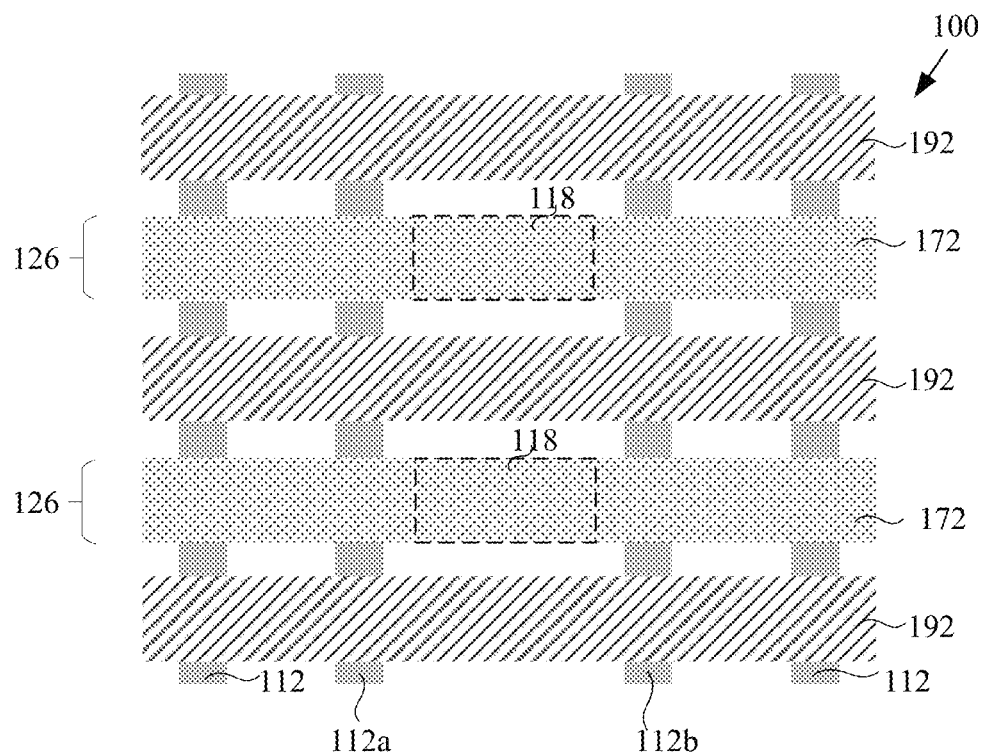
FIG. 12 is a top view of a semiconductor device in accordance with one or more aspects of the disclosure.

FIG. 12 is a top view of a semiconductor device 100 in accordance to one or more aspects of the disclosure. Referring to FIG. 12, the location of the dielectric block 118 in the gate structure 126 is shown as dashed outlines. Source and drain contacts 192 are formed over the semiconductor fins 112. Although not shown, the interlayer dielectric 170 separates the source drain contacts 192 from the gate structures 126. The dielectric block 118 reduces the area of the metal layer 172 parallel to the source and drain contacts 192, hence reducing the parasitic capacitance between the gate and the source drain contacts.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   a substrate;
   a first fin and a second fin disposed on the substrate;
   an isolation material disposed on the substrate, wherein the isolation material separates the first fin and the second fin;
   a dielectric block disposed between the first fin and the second fin, wherein the dielectric block is over the isolation material; and
   a gate electrode covering the dielectric block, wherein the dielectric block is separated from the first fin, the second fin and the isolation material by the gate electrode.

2. The semiconductor device of claim 1, further comprising the gate electrode covering the first fin and the second fin and the isolation material therebetween.

3. The semiconductor device of claim 2, further comprising a metal layer over the gate electrode covering the dielectric block and the first and second fins, wherein the dielectric block is separated from the first fin, the second fin and the isolation material by the metal layer.

4. The semiconductor device of claim 1, wherein the dielectric block comprises silicon dioxide ($SiO_2$), silicon nitride (SiN), silicon oxynitride (SiON), silicon oxycarbonitride (SiOCN), silicon carbonitride (SiCN), silicon oxycarbide (SiOC) or boron-doped silicon carbonitride (SiBCN).

5. The semiconductor device of claim 1, wherein the gate electrode comprises titanium nitride (TiN), tantalum nitride (TaN), aluminum (Al), titanium aluminide (TiAl), aluminum-doped titanium carbide (TiAlC), magnesium (Mg), palladium (Pd), platinum (Pt), molybdenum (Mo) or nickel (Ni).

6. The semiconductor device of claim 3, wherein the metal layer comprises tungsten, cobalt, ruthenium, aluminum or copper.

7. The semiconductor device of claim 1, wherein the isolation material comprises silicon dioxide and silicon nitride.

8. A semiconductor device comprising:
   a substrate;
   a first fin and a second fin disposed on the substrate;
   an isolation material disposed on the substrate, wherein the isolation material separates the first fin and the second fin;
   a gate structure having a dielectric block disposed on the isolation material, wherein the dielectric block is disposed between the first fin and the second fin and is over the isolation material; and
   a gate electrode covering the dielectric block, wherein the dielectric block is separated from the first fin, the second fin and the isolation material by the gate electrode.

9. The semiconductor device of claim 8, further comprising the gate structure having sidewalls and having spacer structures disposed on the sidewalls.

10. The semiconductor device of claim 9, wherein the dielectric block in the gate structure is disposed between the spacer structures.

11. The semiconductor device of claim 9, further comprising the gate structure having a bottom surface, wherein the gate electrode covers the bottom surface and upper and lower portions of the spacer structures of the gate structure.

12. The semiconductor device of claim 11, wherein a metal layer separates the dielectric block from the bottom surface of the gate structure.

13. The semiconductor device of claim 8, wherein the gate structure is traversing across the first fin and the second fin.

14. The semiconductor device of claim 13 further comprising epitaxial structures formed on the first fin and the second fin, wherein the epitaxial structures are adjacent to the gate structure.

15. A method to fabricate a semiconductor device comprising:
   providing a first fin and a second fin disposed on a substrate, wherein the first fin and the second fin are separated by an isolation material;
   depositing a sacrificial material over the first fin, the second fin and the isolation material;
   forming a dielectric block over the sacrificial material between the first fin and the second fin;
   removing the sacrificial material; and
   depositing a gate electrode over the dielectric block.

16. The method of claim 15 further comprising:
   forming a dummy gate material over the dielectric block and the sacrificial material;
   forming a dummy gate structure traversing across the first fin and the second fin and the isolation material, wherein the dummy gate structure has sidewalls and includes the dielectric block and the sacrificial material;
   forming spacer structures on the sidewalls of the dummy gate structure;
   removing the dummy gate material from the dummy gate structure to form a gate structure;

wherein the removal of the sacrificial material further comprises removing the sacrificial material from the dummy gate structure to expose a bottom surface of the gate structure; and wherein the deposition of the gate electrode further comprises depositing the gate electrode over the spacer structures and the bottom surface of the gate structure.

17. The method of claim 16, wherein the deposition of the gate electrode further comprises depositing the gate electrode over the first fin, the second fin and the isolation material; and wherein the formation the gate structure further comprises depositing a metal layer over the dielectric block, the first fin, the second fin, the isolation material, the sidewalls and the bottom surface of the gate structure.

18. The method of claim 17 further comprising:

forming cavities in the first fin and the second fin; and growing epitaxial structures in the fin cavities.

19. The method of claim 18, further comprising:

doping the epitaxial structures to form source and drain regions.

20. The method of claim 15, wherein the sacrificial material is removed by wet etch or dry etch.

\* \* \* \* \*